United States Patent
Tokumitsu et al.

(10) Patent No.: US 7,304,395 B2
(45) Date of Patent: Dec. 4, 2007

(54) SEMICONDUCTOR CHIP PACKAGE (75) Inventors: Akira Tokumitsu, Miyazaki (JP);
Fumihiko Ooka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/478,850

(22) Filed: Jul. 3, 2006

(65) Prior Publication Data

US 2007/0018314 A1 Jan. 25, 2007

(30) Foreign Application Priority Data

Jul. 5, 2005 (JP) .............................. 2005-195833

(51) Int. Cl.
*H01L 23/48* (2006.01)
*H01L 23/52* (2006.01)
*H01L 29/40* (2006.01)

(52) U.S. Cl. ..................... 257/784; 257/778; 438/123

(58) Field of Classification Search ................ 257/123, 257/678, 690, 710, 778, 784; 438/123, 124, 438/127
See application file for complete search history.

(56) References Cited

U.S. PATENT DOCUMENTS

2005/0116327 A1* 6/2005 Danno et al. ................ 257/678

2005/0253208 A1* 11/2005 Otani ........................ 257/415

FOREIGN PATENT DOCUMENTS

| JP | 07-225240 | 8/1995 |
| JP | 11-135804 | 5/1999 |

* cited by examiner

*Primary Examiner*—Phuc T. Dang
(74) *Attorney, Agent, or Firm*—Rabin & Berdo, P.C.

(57) ABSTRACT

A semiconductor chip package includes a first semiconductor chip, that is an MEMS chip having a movable structure. The movable structure has a movable section. The first semiconductor chip includes a plurality of first electrode pads, and a first sealing section. The first sealing section is a closed loop formed on the top face of the frame section surrounding the movable structure. The first semiconductor chip also includes a thin plate member for sealing the movable structure. The semiconductor chip package also includes a second semiconductor chip. The second semiconductor chip has a plurality of second electrode pads. The semiconductor chip package also includes a substrate. The substrate has third electrode pads. The first and second semiconductor chips are mounted on the substrate. First bonding wires connect the first electrode pads to the second electrode pads. Second bonding wires connect the second electrode pads to the third electrode pads.

11 Claims, 9 Drawing Sheets

SEMICONDUCTOR CHIP PACKAGE

BACKGROUND OF THE INVENTION

1. Field of the Invention

The present invention relates to a semiconductor chip package and a fabrication method thereof.

2. Description of the Related Art

Technology to fabricate a several hundred μm size micro structure using micro machining technology, such as semiconductor micro processing technology, has been developing. For example, application of this technology to various sensors, optical switches in the optical communication field and radio frequency (RF) components has begun.

Such micro structures can be fabricated using a conventional semiconductor fabrication process, so that it can be integrated into a single chip.

A chip on which a system having specific functions, including this micro structure, is constructed is called a Micro-Electrical-Mechanical System (MEMS) chip, or a Micro-System-Technology (MIST) chip (hereafter simply called an MEMS device). One example of known MEMS devices is an acceleration sensor, and disclosed in Japanese Patent Application Kokai (Laid-Open) No. 11-135804.

The piezo acceleration sensor chip disclosed in Japanese Patent Application Kokai No. 11-135804 has a frame. This frame includes a center section and beam sections. The beam sections extend between the inner side face of the frame and the center section. The weight section is supported in the center section such that the weight section can oscillate. The support member supports the bottom face of the frame, and encloses the outer edge of the weight section via notches.

The weight section is an element that is moved by external force (stress), so that it is also called a "movable section" or "movable element." The movable element and the beams are integrated into a micro structure. Each beam is thin and narrow.

The sensor chip having this configuration is generally provided as a packaged device.

An example of conventional acceleration sensor chip packages will now be described with reference to FIGS. 9A and 9B of the accompanying drawings.

Figure 9A:
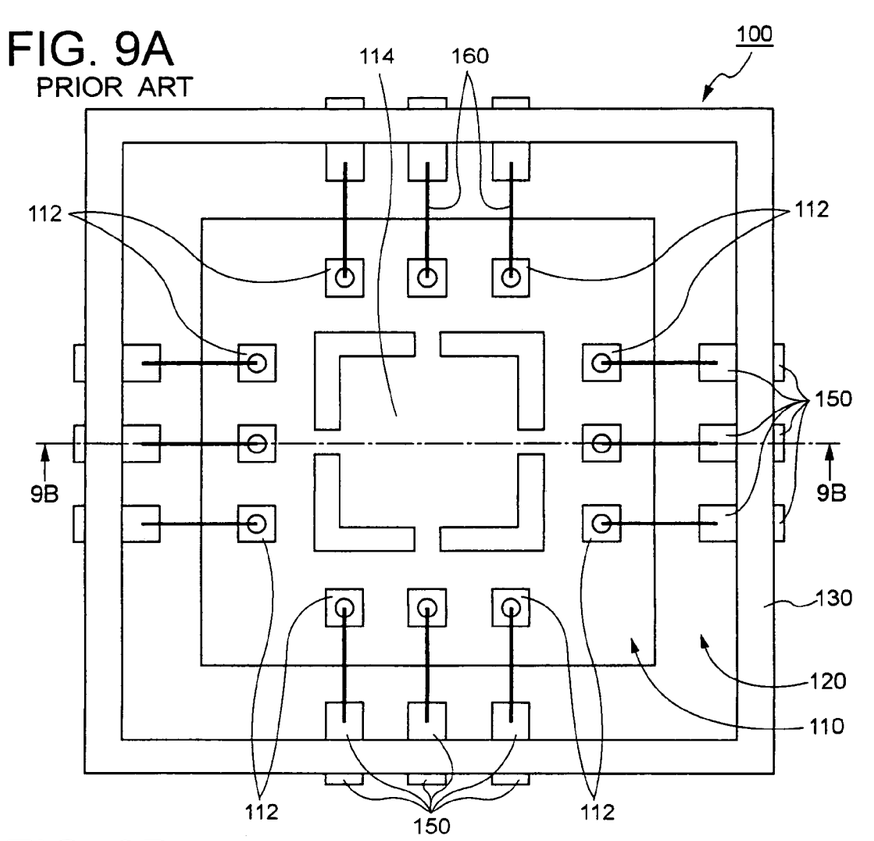
FIG. 9A is a plan view of a conventional semiconductor device.

FIG. 9A is a plan view depicting the composing elements of a conventional acceleration sensor chip package. To show the internal configuration, an illustration of the top face of the protective cover (will be described) is omitted.

Figure 9B:
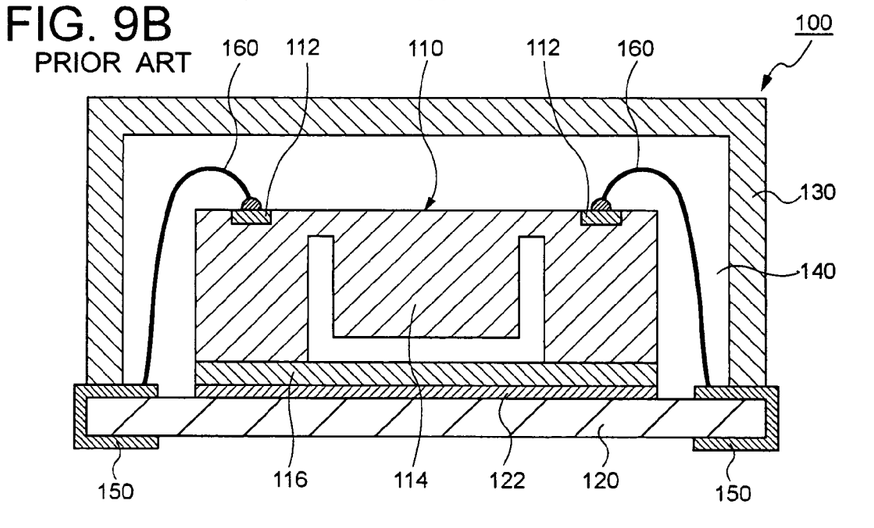
FIG. 9B is a cross-sectional view taken along the line 9B-9B in FIG. 9A.

FIG. 9B is a cross sectional view taken along the dashed line 9B-9B in FIG. 9A.

This acceleration sensor chip package 100 has an acceleration sensor chip 110. The acceleration sensor chip 110 has a plurality of electrode pads 112. The electrode pads 112 are pads for supplying signals to another element from the acceleration sensor chip 110 or introducing signals to the acceleration sensor chip 110. In the acceleration sensor chip 110, a movable structure 114, which operates mechanically, is built in.

The acceleration sensor chip 110 also has a sealing substrate 116 which seals and restricts the movement of the movable structure 114. This sealing substrate 116 is bonded to the substrate 120 by adhesive material 122.

The protective cover 130 has a turned bowl shape. On the substrate 120, the lower edge of the protective cover 130 is bonded. The protective cover 130 and sealing substrate 116 constitute a closed space 140 for sealing the acceleration sensor chip 110.

At the edges of the substrate 120, external terminals 150 are provided. The external terminals 150 extend to the outside from inside the closed space 140. In the closed space 140, the external terminals 150 and the electrode pads 112 of the sensor chip 110 are electrically connected to each other by bonding wires 160.

In order to seal the entire chip by mold resin without interfering with the operation of the detecting section of the acceleration sensor, a structure to create a frame-shaped "mold resin inhibited area" around the detecting section is used. Such structure is disclosed in Japanese Patent Application Kokai No. 7-225240.

According to the above described acceleration sensor chip package, the acceleration sensor chip and external terminals are electrically connected by the bonding wires. The protective cover is used to contain the bonding wires and to seal the acceleration sensor chip. Therefore, seal-by-potting using transfer mold or liquid resin cannot be performed, and the area of the package increases.

In the fabrication method of the conventional sensor chip package, the acceleration sensor chip is diced and then packaged. Thus, the cutting chips created during the dicing process may attach to the movable (weight) element and its vicinity. This will hinder the operation of the movable element.

As Japanese Patent Application Kokai No. 7-225240 discloses, for example, attaching a special member to the acceleration sensor chip makes the fabrication steps more complicated. This worsens the throughput not only of the acceleration sensor chip, but also of the acceleration sensor chip package, which is the final product.

Therefore a technology for further downsizing the acceleration sensor chip package, and a technology for improving yield and productivity, particularly by preventing damage of the movable element when the acceleration sensor chip package is fabricated, and implementing simplifier fabrication steps are desired.

SUMMARY OF THE INVENTION

The semiconductor chip package according to one aspect of the present invention has the following configuration.

The semiconductor chip package has a first semiconductor chip, that is an MEMS chip. The first semiconductor chip has a frame section having a top face and a bottom face. The bottom face is generally in parallel to the top face. In the frame section, a movable structure including a movable section is provided. On the top face of the frame section, a plurality of first electrode pads are arranged. On the top face of the frame section, a first sealing section, that is a closed loop, is formed surrounding the movable structure. On the first sealing section, a thin plate member for sealing the movable structure is provided.

The semiconductor chip package also has a second semiconductor chip. The second semiconductor chip has a first surface and a second surface. The second surface is generally in parallel to the first surface. The second semiconductor chip also a plurality of second electrode pads arranged on the first surface.

The semiconductor chip package also has a substrate. The substrate has a first main surface on which a semiconductor chip mounting area is formed. The substrate also has a second main surface which is generally in parallel to the first main surface. The substrate also has a third electrode pads provided along a certain edge of the first main surface outside the semiconductor chip mounting area. The first and second semiconductor chips are mounted on the semiconductor chip mounting area.

The semiconductor chip package has first bonding wires for connecting the first electrode pads to the second electrode pads, and second bonding wires for connecting the second electrode pads to the third electrode pads.

According to the semiconductor chip package of the present invention, only essential space is secured. Thus, remarkable downsizing of the package can be implemented.

A manufacturing method for a semiconductor chip package according to a second aspect of the present invention has the following steps.

The method for fabricating an acceleration sensor chip package has a step of preparing a first semiconductor chip, that is an MEMS chip. The first semiconductor chip includes a frame section having a top face and a bottom face, a movable structure having a movable section formed in the frame section, and a plurality of first electrode pads arranged on the top face of the frame section. The top face is generally in parallel to the bottom face. A first sealing section, that is a closed loop, is provided on the top face of the frame section to surround the movable structure. A thin plate member is provided on the first sealing section for sealing the movable structure. The fabrication method also includes a step of preparing a second semiconductor chip. The second semiconductor chip includes a first surface having a plurality of sides and a second surface, and a plurality of second electrode pads arranged on the first surface. The first surface is generally in parallel to the second surface. The fabrication method also includes a step of preparing a substrate. The substrate includes a first main surface on which a semiconductor chip mounting area is formed, a second main surface in parallel to the first main surface, and third electrode pads formed along one edge of the first main surface outside the semiconductor chip mounting area. The fabrication method also includes a step of mounting the first and second semiconductor chips on the chip mounting area of the substrate. The fabrication method also includes a step of forming first bonding wires for connecting the first electrode pads to the second electrode pads, and second bonding wires for connecting the second electrode pads to the third electrode pads.

According to the semiconductor chip package fabrication method of the present invention, acceleration sensor chip packages are fabricated in simple steps, and yield can be remarkably improved.

The MEMS chips (first semiconductor chip) of the package are individually separated after the first sealing section is formed for each chip on the wafer level. Thus, only if the semiconductor substrate is positioned, positioning for each chip is unnecessary, and therefore positioning accuracy, that is repeatability, can be improved. As a result, the first sealing section can be accurately formed. Therefore an improvement of yield and productivity of MEMS chips and the package including the MEMS chips can be expected.

DETAILED DESCRIPTION OF THE PRESENT INVENTION

Embodiments of the present invention will now be described with reference to the drawings. In the drawings, the shape, size and positional relationship of each composing element are shown just enough to assist in understanding the present invention, and therefore the present invention is not limited to the illustrated examples.

In the following description, specific materials, conditions and numerics may be used, but these are merely examples, and the present invention is not limited by these examples.

In the drawings, the same composing elements are denoted with the same reference symbols, and redundant description thereof may be omitted.

FIRST EMBODIMENT

First a configuration example of the semiconductor chip of the present invention will be described with reference to FIG. 1A and FIG. 1B. Here a piezo acceleration sensor chip having a piezo resistance element as the functional element will be described.

Here the acceleration sensor chip is a chip that can measure acceleration (hereafter also called "chip"), and the acceleration sensor chip package is a packaged device including this acceleration sensor chip.

Figure 1A:
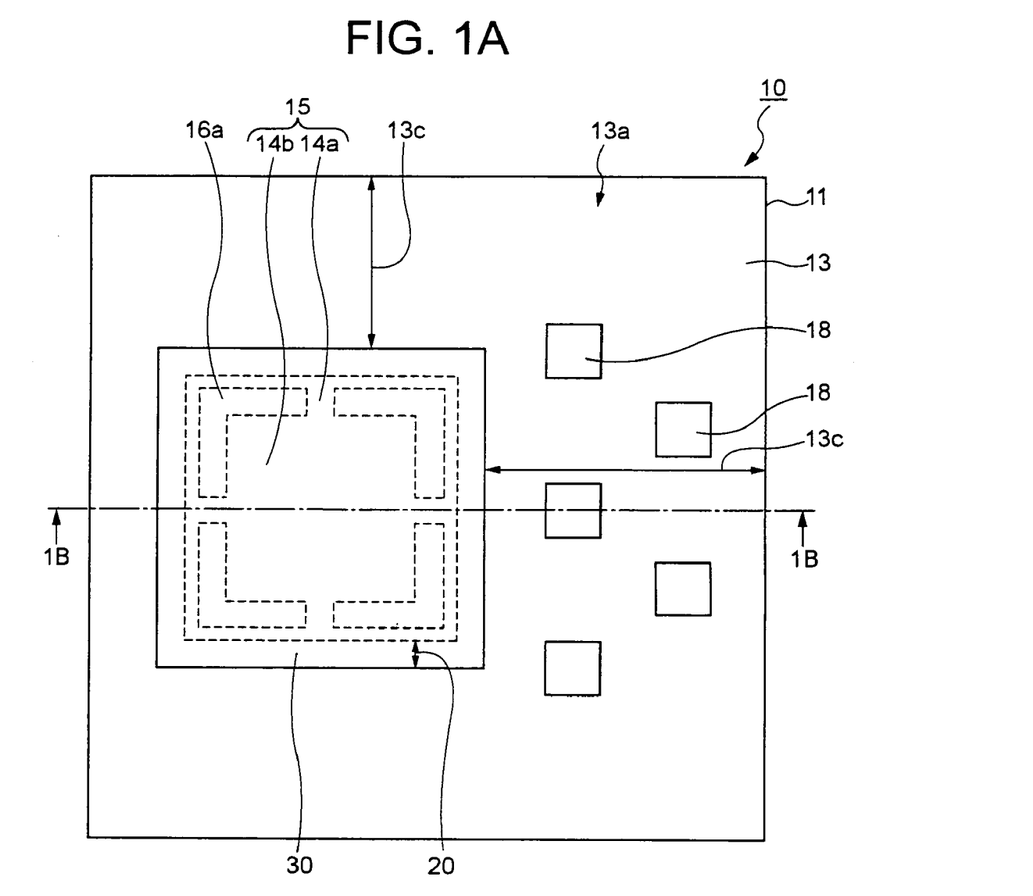
FIG. 1A is a plan view depicting the composing elements of the semiconductor chip.

FIG. 1A illustrates the composing elements of the semiconductor chip of this embodiment viewed from the top.

Figure 1B:
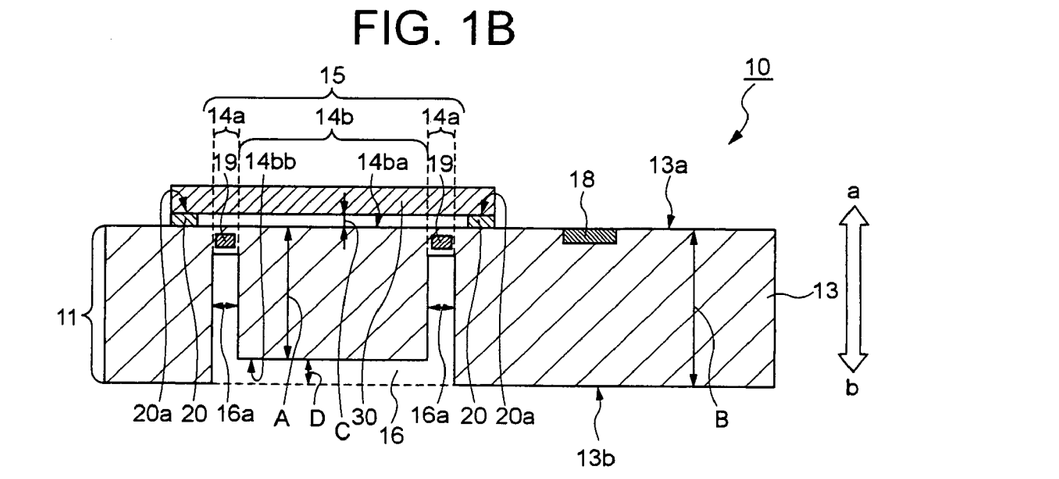
FIG. 1B is a cross-sectional view taken along the dashed line 1B-1B in FIG. 1A.

As FIG. 1A and FIG. 1B show, the first semiconductor chip 10 includes a chip 11. The chip 11 includes a frame section 13 having the top face 13a and the bottom face 13b. The bottom face 13b is generally in parallel to the top face 13a. The frame section 13 is a square frame defining the outer shape (contour) of the chip 11.

The chip 11 has the opening section 16. In this embodiment, the opening section 16 is a through hole surrounded by the frame section 13.

The chip 11 has the movable structure 15. This movable structure 15 has beam sections 14a and movable (weight) section 14b. The movable section 14b is continuous to the beam sections 14a and movable.

From the frame section 13, the beam sections 14a protrude to the opening section 16. The beam sections 14a have a thin thickness and narrow width. The beam sections 14a are flexible sections which deflect (bend) when the movable section 14b moves.

At the tips of the beam sections 14a protruding into the opening section 16, the movable section 14b is provided. The movable section 14b is suspended in the opening section 16 by the beam sections 14a, and is received within the opening section 16.

The height of the top face 14ba of the movable section 14b is roughly the same as the height of the frame section 13 and beam sections 14a, and the thickness A of the movable section 14b is smaller than the thickness B of the frame section 13. The movable section 14b is supported in the hollow-area of the opening section 16 by the beam sections 14a.

The movable structure 15 is formed in a silicon wafer. The frame section 13 is continuous to the beam sections 14a. By this continuity or integration, the frame section 13 supports the beam sections 14a and the beam sections 14a support the movable section 14b.

The movable section 14b must be structured so as to be able to move in the arrow a and b directions in FIG. 1B for measurement of acceleration. In order to prevent direct contact of the movable section 14b with the frame section 13 and prevent the movement of the movable section 14b from being hindered by the beam sections 14a, the movable section 14b and frame section 13 are separated from each other with the space 16a, and the side edges of the beam sections 14a and movable section 14b, except the portions connecting the frame section 13 with the movable section 14b, are also separated from each other with the space 16a.

In this embodiment, the movable structure 15 has the four beam sections 14a and the movable section 14b supported from four directions by the four beam sections 14a. It should be noted, however, that the configuration of the semiconductor chip of the present invention is not limited to this configuration example. For instance, various known configurations used for the movable structure of an MEMS chip can be employed. If the semiconductor chip is an acceleration sensor chip, the movable section 14b may be supported from one direction, i.e., a so called cantilever type configuration may be employed.

The first semiconductor chip 10 shown in FIG. 1A has the same size (outer dimensions) as the chip 11 viewed from the top (or bottom). The shape of the first semiconductor chip 10 is rectangular parallelepiped in the illustrated embodiment, but the present invention is not limited in this regard.

In the configuration shown in FIG. 1A and FIG. 1B, each beam section 14a protrudes from the center of each side of the square-shaped frame section 13 into the opening section 16 at right angles. The upper surfaces of the beam sections 14a are coplanar to the upper surface of the frame section 13.

The movable section 14b is supported by the tips of the four protruding portions of the beam sections 14a. The movable section 14b is cubic in this example. The two-dimensional shape of the movable section 14b, when viewed from the top, is a square, and each beam section 14a is connected to the center part of each of the four sides of the square which is the top face of the cube.

In this embodiment, the shape of the movable section 14b is cubic. However the present invention is not limited to this, and can have other shapes according to the expected acceleration and measurement conditions.

On the beam sections 14a, the detection elements 19 are provided. These detection elements 19 are piezo resistance elements in this embodiment.

An appropriate number of detection elements 19 are arranged at appropriate positions according to the design, which allows the desired measurement of acceleration. The detection elements 19 are elements for detecting the displacement (acceleration) of the movable structure 15.

It should be noted that the detection element 19 is not limited to the piezo resistance element. For example, a detection element, which is applied to an electrostatic capacitance type acceleration sensor, can be used.

To each of the piezo resistance elements 19, a wire for supplying signals to the outside or for receiving signals from the outside to the piezo resistance element 19 is connected (not illustrated). For this wire, a conventional interconnect structure can be used. For wire material, a general material, such as aluminum (Al), can be used.

On the frame 13, the first sealing section 20 is provided surrounding the opening section 16, that is the space 16a, such that the frame section 13 is separated from the edges of the opening section 16.

As FIG. 1B shows, the first sealing section 20 is a closed loop of a line with an equal width. In this embodiment, the outer contour of the first sealing section 20 is square and the inner contour is also square. The first sealing section 20 is spaced from the opening section 16 at an equal distance in all sections.

For the first sealing section 20, it Is preferable to use a known liquid resin, or a sheet material such as a bonding sheet which has an appropriate bonding means.

A partial area of the frame section 13 outside the first sealing section 20 is called the outer area 13c.

On the top face 20a of the first sealing section 20, the thin plate member 30 is bonded by the adhesion of the first sealing section 20.

The thin plate member 30 is spaced from the movable section 14b. In other words, the thin plate member 30 seals the movable structure 15, that is the beam sections 14a and the movable section 14b, from the upper side of the opening section 16 (space 16a), which means the top face 14ba side of the movable section 14b. For this thin plate member 30, resin, silicon (Si), glass and such metal as copper can be used as the material.

The thin plate member 30 seals the movable structure 15, and plays a function to control (restrict) the operation (movement) of the movable section 14b in the upward direction (i.e., in the direction to the top face 14ba). Therefore the height C of the space between the thin plate member 30 and the top face 14ba of the movable section 14b is set to be a value which allows the movable section 14b to move In the arrow a direction to the extent that the acceleration sensor can measure desired acceleration. The thickness of the first sealing section 20 is set to be the same as the height C or greater than the height C so that desired measurement of acceleration is ensured.

The clearance D is the distance between the lower surface 13b of the frame 13 and the lower surface 14bb of the movable section 14b. The-size of the clearance D is decided such that the movable section 14b can move downwards sufficiently for the desired acceleration detection.

Preferably the outer size of the thin plate member 30 is as small as possible, but should not be smaller than the outer size of the first sealing section 20. The outer size of the thin plate member 30 may be greater than the outer contour of the first sealing section 20, but is set to an appropriate size which does not affect the wire bonding to the first electrode pads. The thickness of the thin plate member 30 may be arbitrary, but is preferably as thin as possible within a range where the functions as an MEMS chip are not affected, so that the general thickness of the semiconductor chip 10 is decreased.

The plate member 30 of the first semiconductor chip 10 is extremely thin. Therefore, the thickness of the package can be decreased while achieving sufficient sealing of the movable structure.

On the area 13c of the frame section 13, which is defined outside the first sealing section 20 formed on the frame section 13, a plurality of first electrode pads 18 are provided. The first electrode pads 18 are exposed from the frame section 13.

Generally on the surface of the acceleration sensor chip, an insulation film, such as a passivation film, is formed. The first electrode pads 18 are formed so as to be exposed from this insulation film.

The first electrode pads 18 are electrically connected to the detection elements 19 of the beam sections 14a via the above mentioned interconnects, which are not illustrated.

In this embodiment, five first electrode pads 18 are staggered in two rows along one of the four sides of the square plate member 30, so that wire bonding is possible.

Now the operation of the semiconductor chip 10 will be briefly described.

When acceleration is applied to the semiconductor chip 10, the movable section 14b displaces. In other words, a deflection amount, according to the displacement of the movable section 14b, is generated on the beam sections 14a supporting the movable section 14b. This deflection amount is measured as the electrical change amount of resistance of the detection elements 19 formed in the beam sections 14a. The measured change amount of the resistance value is sent to the control chip via the first electrode pads 18 electrically connected to the detection elements 19. In this way, the acceleration applied to the semiconductor chip 10 is quantitatively detected.

According to the semiconductor chip of this embodiment, the movable section 14b sensitive to stress, such as impact, can be sealed in a minimum area and minimum height, so that a slimmer semiconductor chip can be implemented.

Now a fabrication method for the first semiconductor chip 10 will be described with reference to FIG. 2A to FIG. 5B.

The fabrication method for the semiconductor chip 10 is characterized in that the movable structure is formed on the wafer level, the first sealing section and plate element are formed to seal the movable structure, and the wafer is separated into dies (individual semiconductor chips 10).

Now each fabrication step will be described. In the following description of the fabrication method, only the area where two adjacent chip areas are formed, out of many chip areas arranged in staggered positions which are simultaneously formed, will be illustrated on the wafer level and described, FIG. 2A is a plan view depicting the semiconductor chip during fabrication on the wafer level, and FIG. 2B is a cross-section of the semiconductor chip during fabrication on the wafer level, sectioned at the dashed line 2B-2B in FIG. 2A.

Figure 2A:
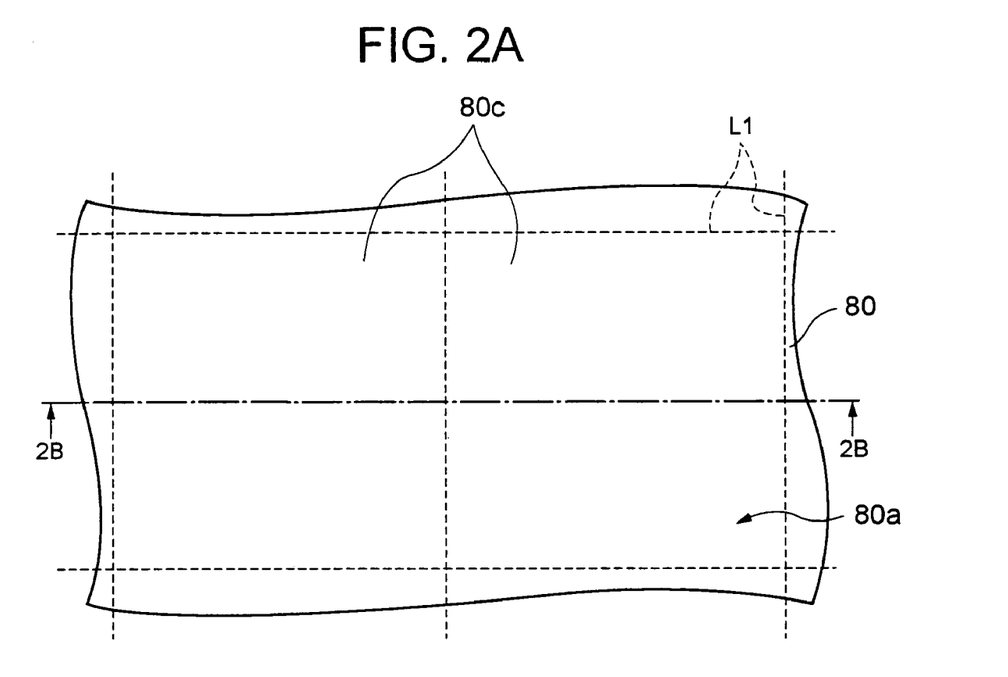
FIG. 2A is a plan view depicting the semiconductor chip during fabrication on the waver level.
Figure 2B:
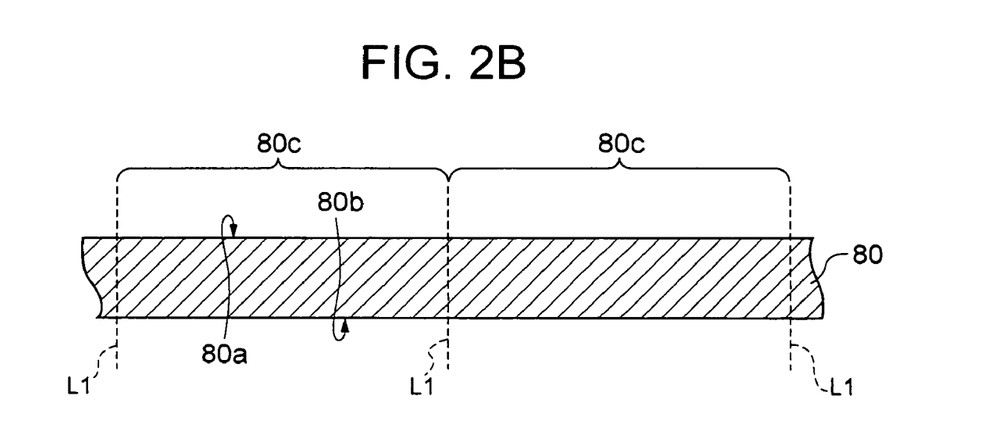
FIG. 2B is a Cross-sectional view taken along the dashed line 2B-2B, which is the same line as the dashed line 1B-1B in FIG. 1A.

FIGS. 3A, 3B, 4A, 4B, 5A and 5B are a series of diagrams continuing from FIGS. 2A and 2B.

First, as FIG. 2A and FIG. 2B show, a silicon wafer 80, which is a semiconductor substrate, is prepared. The silicon wafer 80 has a first face 80a and a second face 80b. The second face is generally in parallel to the first face 80a.

On the silicon wafer 80, a plurality of chip areas 80c are partitioned. This chip area 80c is an area which in the end becomes a semiconductor chip in the die separation step.

In FIG. 2A, the dotted lines L1 separating the chip areas 80c are scribe lines (dicing lines).

Figure 3A:
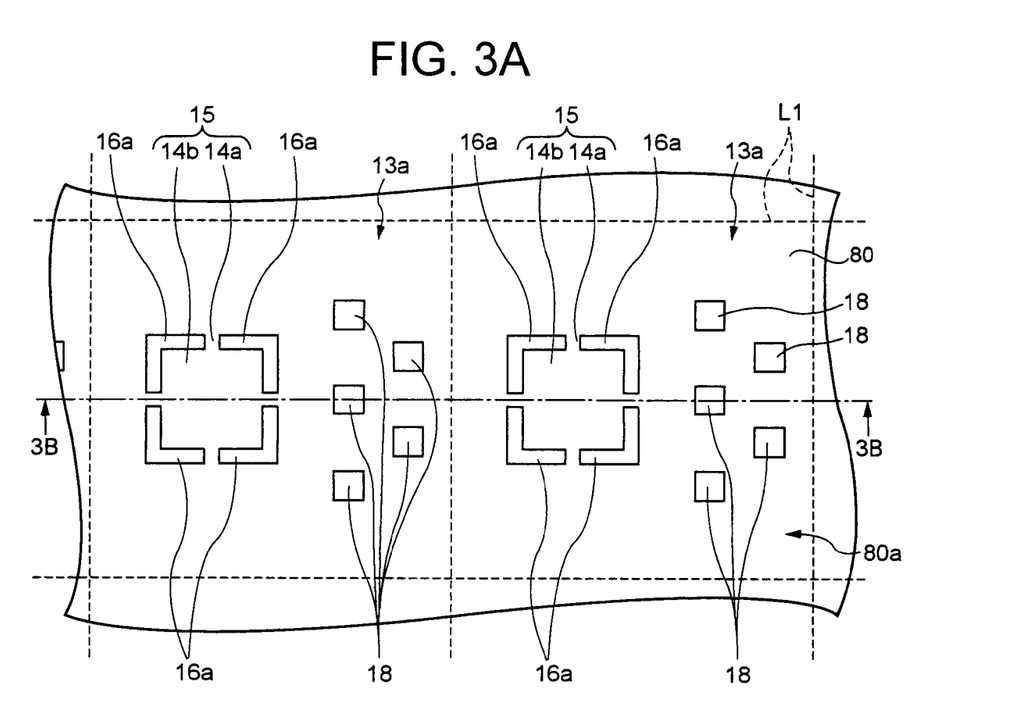
FIG. 3A is a plan view similar to FIG. 2A, showing the semiconductor chip subsequent to FIG. 2A during the manufacturing process.
Figure 3B:
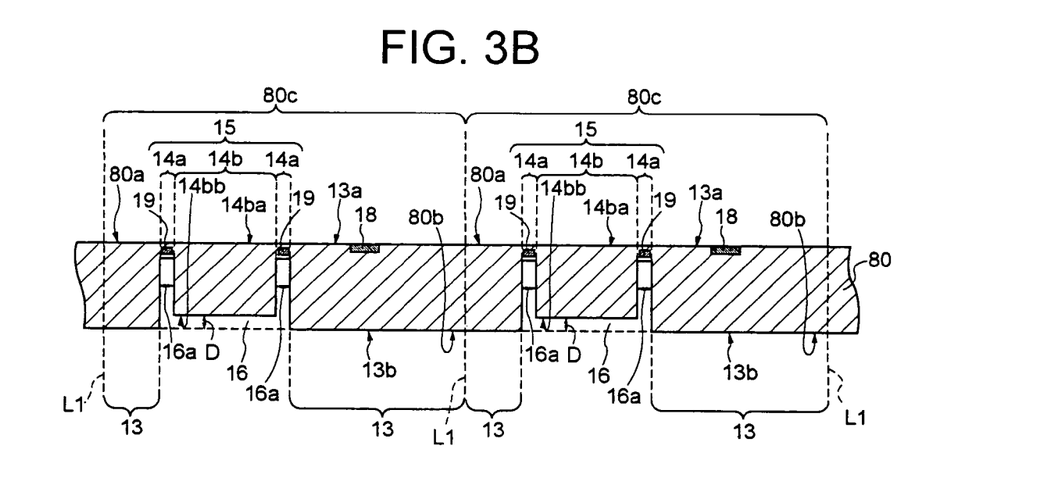
FIG. 3B is a cross-sectional view similar to FIG. 2B, showing the semiconductor chip subsequent to FIG. 2B during the manufacturing process.

Then as FIG. 3A and FIG. 3B show, the movable structure 15 is formed in the silicon wafer 80 by processing the silicon wafer 80 by a known photolithography step and etching step. In other words, the movable structure 15, which plays an essential function of the acceleration sensor, is formed into each chip area 80c. As mentioned above, the movable structure 15 has the movable section 14b and the beam sections 14a for supporting this movable section 14b.

For specific steps of providing the elements of the acceleration sensor chip 11 including this movable structure 15, appropriate conventional processes can be used. These formation steps are not the point of this embodiment, so that a detailed description thereof is omitted.

In a predetermined position of a beam section 14a, a function element 19 for detecting acceleration, that is a piezo electric element 19 is formed by an ordinary wafer process.

To the piezo resistance element 19, one end of an interconnect (not shown) is electrically connected. This interconnect is made of aluminum (Al) for example, and is formed using an ordinary method. The other end of this interconnect is in an area outside the movable structure 15 in the chip area 80c, such that this interconnect extends to a predetermined position of the frame section 13. This interconnect is covered by the insulation film, as mentioned above.

At the other end of this interconnect, a first electrode pad 18, exposed from the surface of the frame section 13, is formed 80 as to be electrically connected. The first electrode pad 18 may be formed by exposing a part of the interconnect from the insulation film formed on the surface of the frame section 13 of the acceleration sensor chip 11.

Figure 4A:
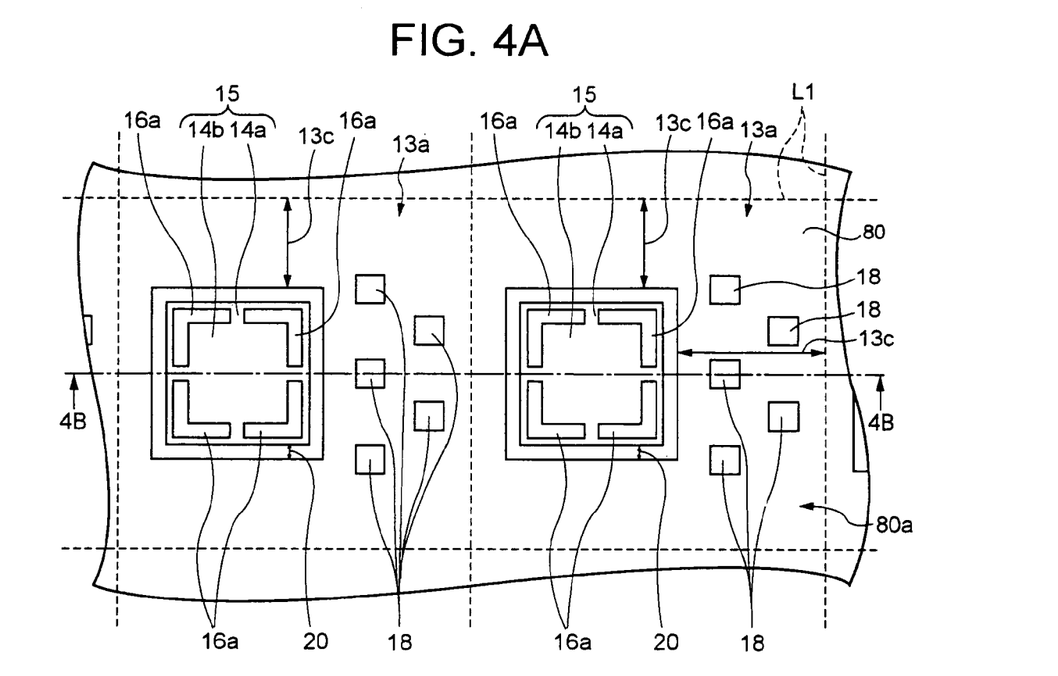
FIG. 4A is a plan view similar to FIG. 2A, showing the semiconductor chip subsequent to FIG. 3A during the manufacturing process.
Figure 4B:
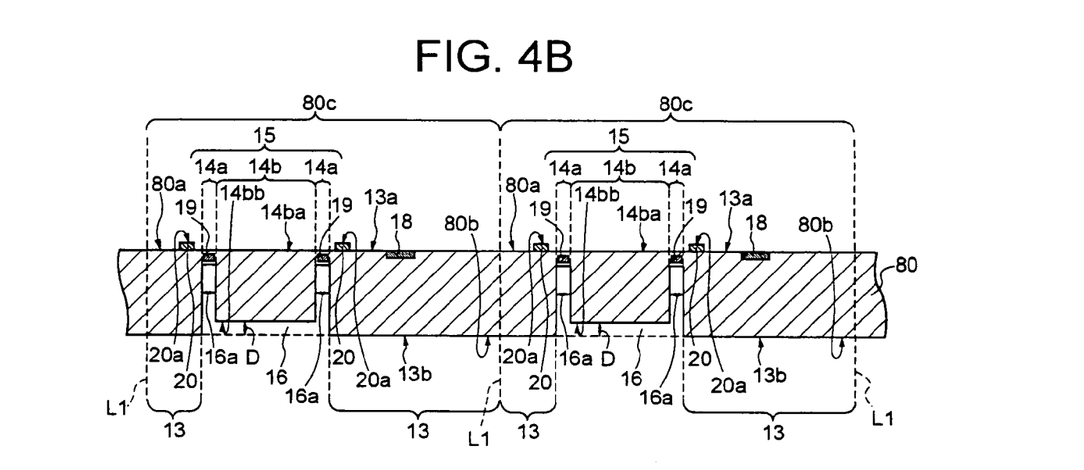
FIG. 4B is a cross-sectional view similar to FIG. 2I, showing the semiconductor chip subsequent to FIG. 3B during the manufacturing process.

Then as FIG. 4A and FIG. 4B show, the first sealing section 20 is formed. One first sealing section 20 is formed in each of the chip areas 80c existing in a matrix. If the first sealing section 20 is formed by a sheet member, the sheet member is molded in a frame shape in advance, and is placed on each chip area 80c. If the first sealing section 20 is formed with liquid resin, a known dispense method using a dispenser, that is an injection step, can be used. The first sealing section 20 is contacted and bonded on the first face (upper face) 80a of the silicon wafer 80 without making any gap.

If the first sealing section 20 is formed in each chip area 80c on the wafer level in this manner, positioning for each chip, that is for each chip area 80c, becomes unnecessary once the silicon wafer 80 is positioned. Thus, positioning accuracy, that is repeatability, can be improved. As a result, the first sealing section 20 can be accurately formed in each chip area 80c. Therefore an improvement of yield can be expected.

Figure 5A:
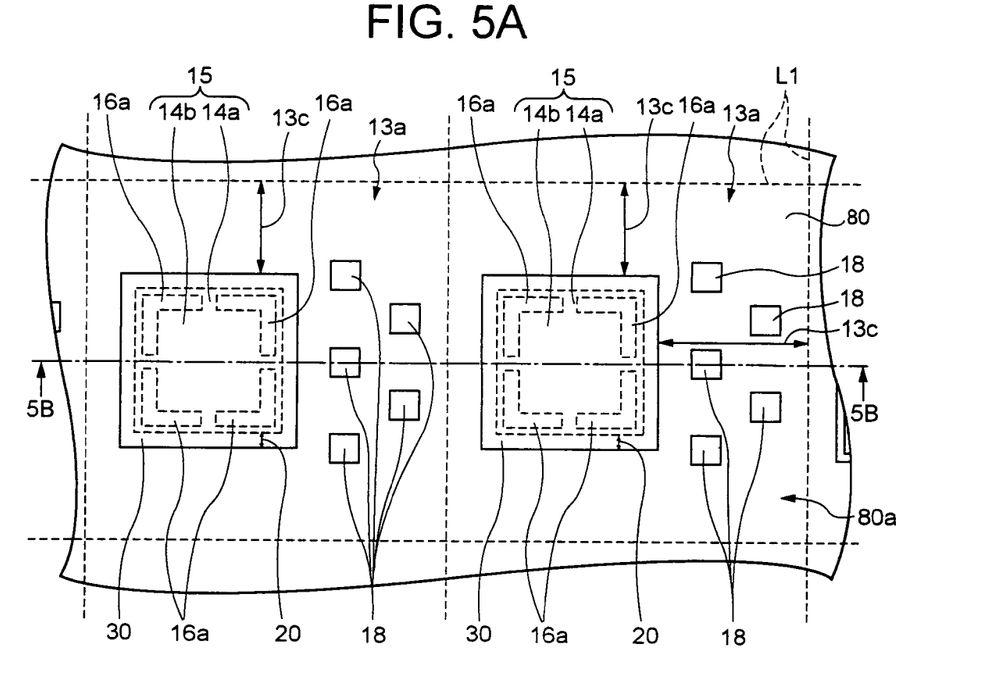
FIG. 5A is a plan view similar to FIG. 2A, showing the semiconductor chip subsequent to FIG. 4A during the manufacturing process.
Figure 5B:
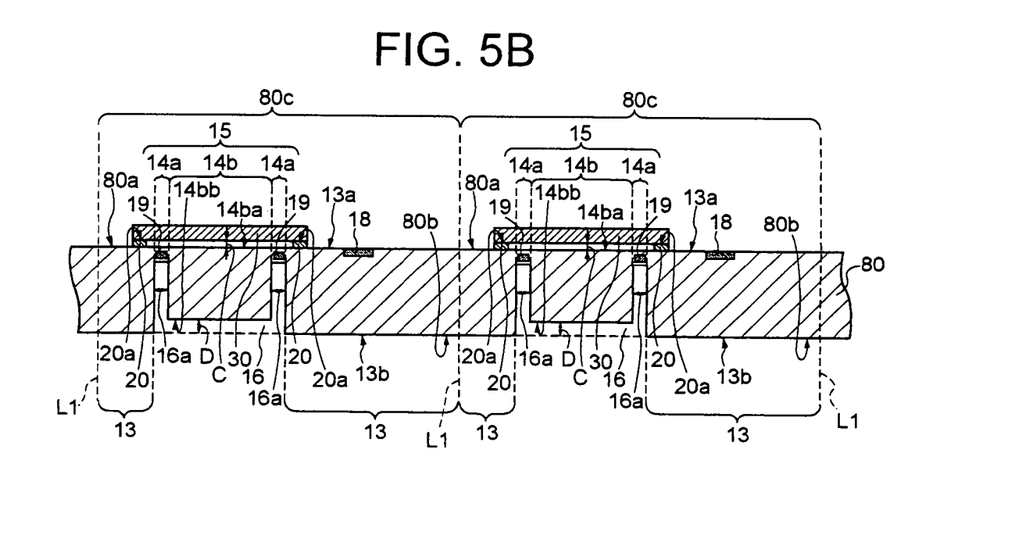
FIG. 5B is a cross-sectional view similar to FIG. 2B, showing the semiconductor chip subsequent to FIG. 4B during the manufacturing process.

Next, as FIG. 5A and FIG. 5B show, the thin plate member 30 is bonded on the entire top face 20a of the first sealing section 20 without a gap. This thin plate member 30 is spaced from the movable structure 15. In other words, the thin plate member 30 seals the movable structure 15, together with the first sealing section 20, from the upper face side of the movable structure 15.

In this step, to form the first sealing section 20 by a sheet member, the first sealing section 20 and the thin plate member 30 are contacted and bonded by performing appropriate processing on the selected sheet member. For example, if the first sealing section 20 is a thermo-compression sheet, the thin plate member 30 is placed on the top face 20a of the first sealing section 20, and thermo-compression is performed without a gap under predetermined conditions.

If the first sealing section 20 is made from liquid resin, the thin plate member 30 is placed on the top face 20a of the first sealing section 20, and the liquid resin is cured under predetermined conditions.

Then as FIG. 5A and FIG. 5B show, dicing is performed on the area between the adjacent chip areas 80c, that is along the scribe lines L1, using a conventional dicing device.

In this way, a plurality of semiconductor chips 10 having an identical structure, as described with reference to FIGS. 1A and 1B, can be fabricated from one wafer.

According to this fabrication method, the first sealing section 20 is formed on the wafer level, so that position accuracy of the first sealing section 20 in the chip area 80c, that is repeatability, can be improved. As a result, the first sealing section 20 can be formed accurately in each chip area 80c. Therefore improvement of yield of the semiconductor chips 10 can be expected.

SECOND EMBODIMENT

The second embodiment of the present invention will be described with reference to FIGS. 6A and 6B. The second embodiment relates to a packaged semiconductor device including the semiconductor chip having the configuration described above.

Figure 6A:
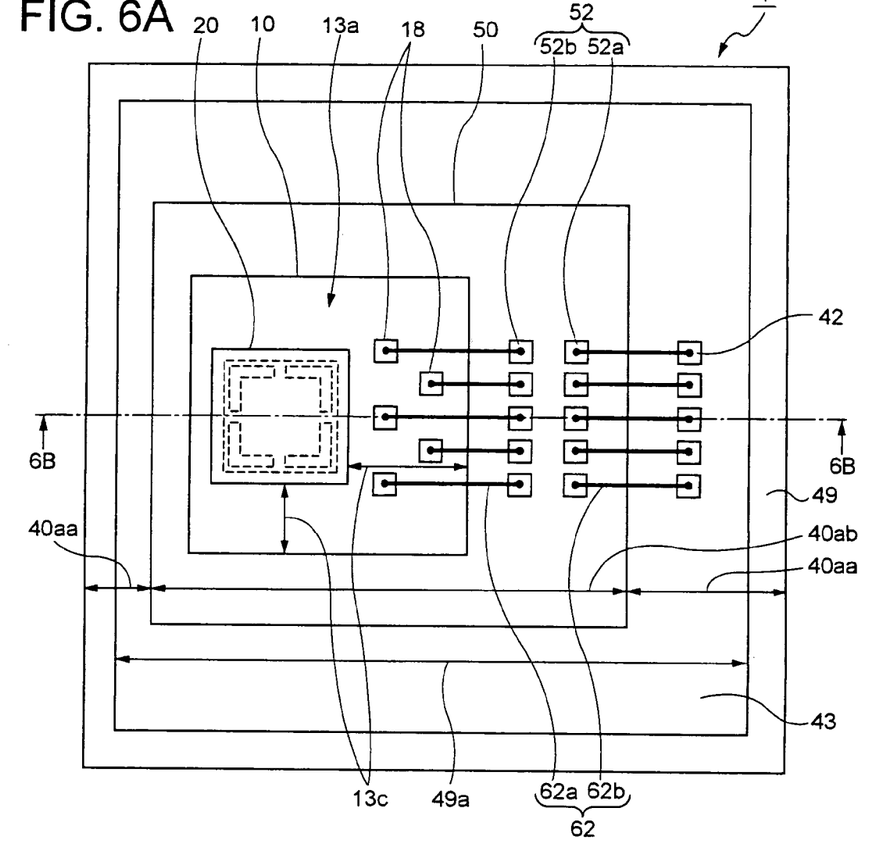
FIG. 6A is a plan view depicting the composing elements of the semiconductor device according to the second embodiment of the present invention.

FIG. 6A depicts the composing elements of the semiconductor chip package of the second embodiment viewed from the top. FIG. 6B is a cross-section sectioned at the dashed line 6B-6B in FIG. 6A.

The semiconductor chip package of this embodiment is characterized in that the ceramic header is used for the substrate on which the semiconductor chip is mounted.

The ceramic header is a ceramic substrate having a concave section in which the semiconductor chip is received and mounted. Thus, the ceramic header is a container type ceramic substrate.

Figure 6B:
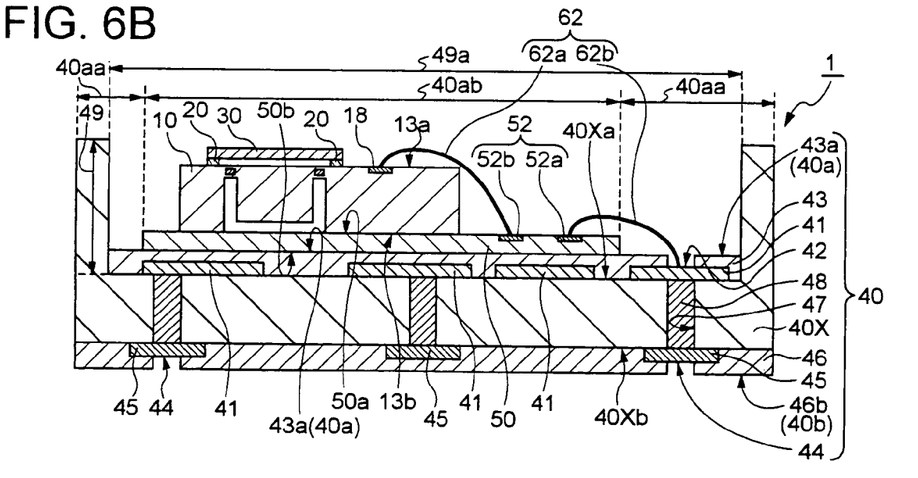
FIG. 6B is a cross-sectional view taken along the dashed line 6B-6B in FIG. 6A.

As FIG. 6A and FIG. 6B show, the semiconductor chip package 1 includes the ceramic header 40.

The ceramic header 40 has a first main surface 40a and a second main surface 40b. The second main surface 40b is generally in parallel to the first main surface 40a. The ceramic header 40 has a plurality of third electrode pads 42 exposed from the first main surface 40a. The positions and number of the third electrode pads 42 are decided considering the positions and number of second electrode pads 52 of the second semiconductor chip 50, which are connected to the third electrode pads 42. The third electrode pads 42 are disposed in an area not covered by the second semiconductor chip 50 mounted on the ceramic header.

The ceramic header 40 has a plurality of external terminals 44. The external terminals 44 are exposed from the second main surface 40b. The external terminals 44 function as electrodes to electrically connect the semiconductor chip package 1 to the packaging substrate.

In this embodiment, the ceramic header 40 has a base material 40X which has a single-layer structure. The ceramic header 40 has a first interconnect layer 41 including a plurality of interconnect sections on the surface 40Xa of the base material 40X at the first main surface 40a side. On the first interconnect layer 41, the first insulation film 43 is formed so as to cover the first interconnect layer 41. The surface 43a of the first insulation film 43 Is the first main surface 40a of the ceramic header 40. In the first insulation film 43, the opening section is formed so as to expose a part of the interconnect section of the first-interconnect layer 41. This exposed portion becomes the third electrode pads 42.

The ceramic header 40 has a second interconnect layer 45 including a plurality of interconnect sections on the back face 40Xb of the base material 40X at the second main surface 40b side. On the second interconnect layer 45, the second insulation film 46 is formed so as to cover the second interconnect layer 45. The surface 46b of the second insulation film 46 corresponds to the second main surface 40b of the ceramic header 40.

In the second insulation film 46, an opening section is formed so as to expose a part of the interconnect section of the second interconnect layer 45. This exposed section becomes an external terminal 44. In the illustrated embodiment, the external terminal 44 is a flat pad.

The ceramic header 40 has a side wall 49 which defines the concave section 49a. The side wall 49 exists in the edge area 40aa of the first main surface 40a.

The edge area 40aa is a combination of rectangular areas between the semiconductor chip mounting area and the side wall 49. The area of the ceramic container 40 inside the edge area 40aa is referred to as the inner area 40ab. The inner area 40ab corresponds to the inner bottom face of the container 40 in which the semiconductor chip is mounted. In this embodiment, the first interconnect layer 41, third electrode pads 42, first insulation film 43, external terminals 44, second interconnect layer 45, through holes 47 and filling-in contacts 48 are formed in the inner area 40ab.

Five third electrode pads 42 are linearly arranged along one side of the square inner area 40ab.

The side wall 49 is formed in the edge area 40aa so as to be vertical to the first main surface 40a. As FIG. 6A shows, the side wall 49 is formed to be a closed frame surrounding the inner area 40ab.

The first and second semiconductor chips 10 and 50 are mounted in the inner area 40ab.

The configuration of the first semiconductor chip 10 in the second embodiment is the same as the first semiconductor chip 10 in the first embodiment, which is described with reference to FIG. 1A to FIG. 5B, and therefore a detailed description thereof is omitted.

Now the configuration of the second semiconductor chip 50 will be described. The second semiconductor chip 50 performs electrical operation to control the operation of the MEMS chip, for example. The control chip normally has such functions as an amplifier function, angle calibration function, AD conversion function, DA conversion function and memory function.

The second semiconductor chip 50 has a rectangular parallelepiped shape that has a square first face 50a and a square second face 50b. The second face 50b is generally in parallel to the first face 50a. The second semiconductor chip 50 has second electrode pads 52. The second electrode pads 52 are exposed from the first face 50a. Ten second electrode pads 52 are arranged in two rows along one side of the square in this embodiment.

The second electrode pads 52 include pads 52b for connecting the first semiconductor chip, and pads 52a for connecting the substrate. Out of the two rows of second electrode pads 52, one row closer to the side of the square is the substrate connection pads 52a. The substrate connection pads 52a are electrode pads to connect the third electrode pads 42 of the ceramic header 40 The other row close to the center area of the second semiconductor chip is the first semiconductor chip connection pads 52b. The first semiconductor chip connection pads 52b are electrode pads to connect the first electrode pads 18 of the first semiconductor chip 10.

The second semiconductor chip 50 is mounted on the ceramic header 40 such that the second face 50b thereof faces the first main surface 40a, and the third electrode pads 42 are exposed. The second semiconductor chip 50 is positioned so that the array of the second electrode pads 52 and the array of the third electrode pads 42 are wire bonded to each other. As FIG. 6A shows, the second semiconductor chip 50 is mounted such that the array of the second electrode pads 52 and the array of the third electrode pads 42 are parallel to each other.

The first semiconductor chip 10 is mounted on the second semiconductor chip 50 so that the bottom face 13b of the frame 13 faces the first face 50a of the second semiconductor chip 50, and the second electrode pads 52 are exposed. The first semiconductor chip 10 is positioned such that the array of the first electrode pads 18 and the array of the second electrode pads 52 are wire bonded to each other. In this embodiment, the first semiconductor chip 10 is mounted such that the array of the first electrode pads 18 and the array of the second electrode pads 52 are parallel to each other.

The first and second semiconductor chips 10 and 50, and the ceramic header 40 are electrically connected to each other by bonding wires 62. The bonding wires 62 are bonded according to an ordinary method using such metal thin wire as gold (Au).

The first electrode pads 18 and the first semiconductor chip connection pads 52b are connected one-to-one via the first bonding wires 62a.

The substrate connection pads 52a and the third electrode pads 42 are connected one-to-one via the second bonding wires 62b.

If this package format is used, the sealing can be done while allowing only the movable section to move. It is unnecessary to seal the entire MEMS chip and the bonding wires within a closed space. Thus, the semiconductor chip package can be slimmer and more compact.

The ceramic header 40 has extremely high rigidity so that the ceramic header can increase the resistance of the package against external force.

Now the operation of the semiconductor chip package will be briefly described with reference to FIG. 6A and FIG. 6B. It is assumed that the first semiconductor chip 10, which is an acceleration sensor chip, has detected acceleration. The signals related to the detected acceleration are sent from the first electrode pads 18 to the second semiconductor chip 50, which is a control chip, via the first bonding wires 62a and the first semiconductor chip connection pads 52b. The signals processed by the second semiconductor chip are supplied to the external device (not shown) via the substrate connection pads 52a, second bonding wires 62b, third electrode pads 42 and external terminals 44 of the ceramic header 40. The signals to be introduced to the first or second semiconductor chip are propagated through the reverse route.

The fabrication steps of the semiconductor chip package will be briefly described with reference to FIG. 6A and FIG. 6B.

First, the first semiconductor chip, which is a MEMS chip having the above mentioned configuration, ceramic header 40 and second semiconductor chip are prepared.

In the chip mounting area of the ceramic header 40, that is the inner area 40ab, the first and second semiconductor chips are mounted. In this embodiment, the first and second semiconductor chips 10 and 50 should be stacked. Therefore, these semiconductor chips may be formed as a stacked product in advance, and this stacked product may be mounted on the ceramic header 40.

It should be noted that the first and second semiconductor chips 10 and 50 may be mounted separately or next to each other in the inner area 40a, without being stacked.

Finally, the first bonding wires 62a for connecting the first electrode pads 18 of the first semiconductor chip 10 to the second electrode pads 52 of the second semiconductor chip 50 are formed according to an ordinary method using a known bonding device. Also, the second bonding wires 62b for connecting the second electrode pads 52 of the second semiconductor chip 50 to the third electrode pads 42 of the ceramic header 40 are formed according to an ordinary method using a known bonding device. By these manufacturing steps, the semiconductor chip package 1 is fabricated.

If these steps are used, it is not necessary to seal the entire ceramic header 40. Thus, the semiconductor chip package 1 can be fabricated by simpler steps.

THIRD EMBODIMENT

A semiconductor device according to the third embodiment of the present invention will be described with reference to FIG. 7A and FIG. 7B. The third embodiment relates to a packaged semiconductor device having a metal or resin substrate instead of the ceramic header of the second embodiment.

Figure 7A:
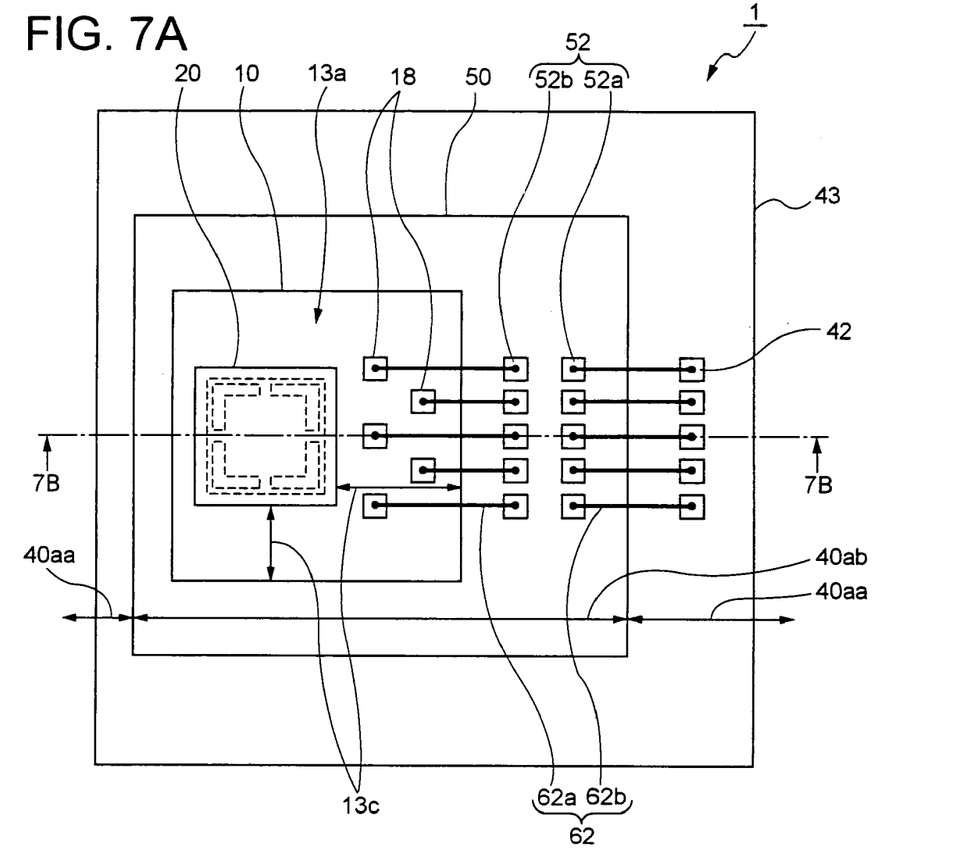
FIG. 7A is a plan view depicting the composing elements of the semiconductor device according to the third embodiment of the present invention.

FIG. 7A depicts the composing elements of the semiconductor chip package of the third embodiment viewed from the top. FIG. 7B is a cross-section sectioned at the dashed line 7B-7B in FIG. 7A. In FIG. 7A, the second sealing section shown in FIG. 7B is omitted to clarify the internal configuration.

The semiconductor device 1 of the present embodiment is fundamentally the same as the semiconductor device of the second embodiment, except that a substrate is used instead of a ceramic header in the packaging. Thus, the same composing elements are denoted with the same reference numbers in FIGS. 6A, 6B, 7A and 7B, and a detailed description thereof is omitted.

The semiconductor chip package 1 includes the substrate 40. For the base material 40X which is the major composing element of the substrate 40, heat resistant polymer material, such as heat-resistant glass-base epoxy-resin and BT resin, are preferably used. The substrate 40 may be a metal substrate of which the base material is copper (Cu) or a copper alloy.

Figure 7B:
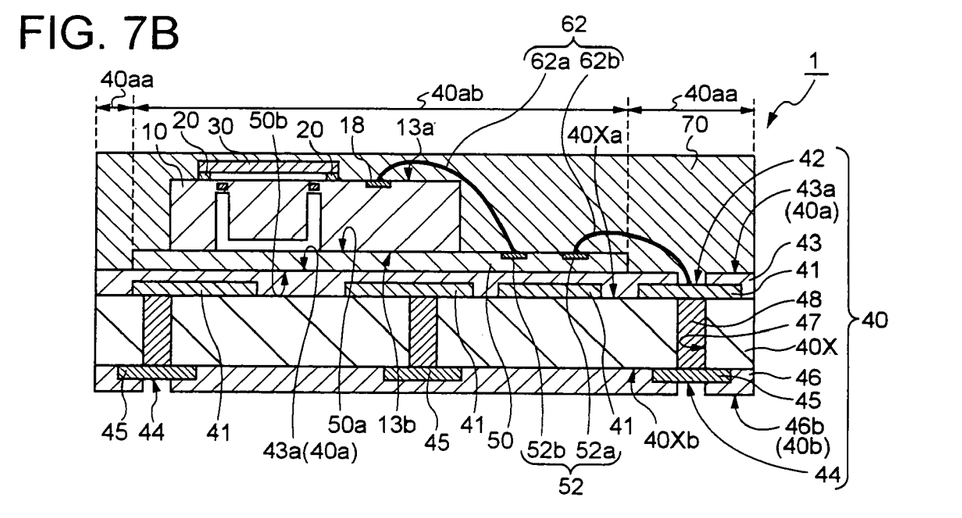
FIG. 7B is a cross-sectional view taken along the dashed line 7B-7B in FIG. 7A.

Specific composing elements of the substrate 40 shown in FIGS. 7A and 7B are the same as the ceramic header shown in FIGS. 6A and 6B, and are denoted with the same reference numbers, so that a detailed description thereof is omitted.

In the third embodiment, a flat type substrate 40 is shown, but a sealing cap which has a container shape, having a concave section for receiving the chip, may be used, just like the ceramic header of the second embodiment.

The semiconductor device 1 has a second sealing section 70 for sealing a first semiconductor chip 10, second semiconductor chip 50 and bonding wires 62. The second sealing section 70 can be formed by a known transfer mold method, using such sealing resin as epoxy mold resin and liquid sealing material.

If this configuration is used, a substrate which is less expensive than a costly ceramic header can be used. Therefore, a remarkable cost reduction is possible.

It should be noted that the second sealing section 70 may be applied to the semiconductor device of the second embodiment having the ceramic header 40 (FIGS. 6A and 6B). In other words, the first semiconductor chip 10, second semiconductor chip 50 and bonding wires 62, located in the concave section 49a of the ceramic header 40 of the second embodiment, may be sealed by sealing resin if so desired.

FOURTH EMBODIMENT

A semiconductor device according to the fourth embodiment of the present invention will be described with reference to FIG. 8A and FIG. 8B. The fourth embodiment relates to a packaged semiconductor device having a lead frame instead of the ceramic header of the second embodiment or the substrate of the third embodiment.

Figure 8A:
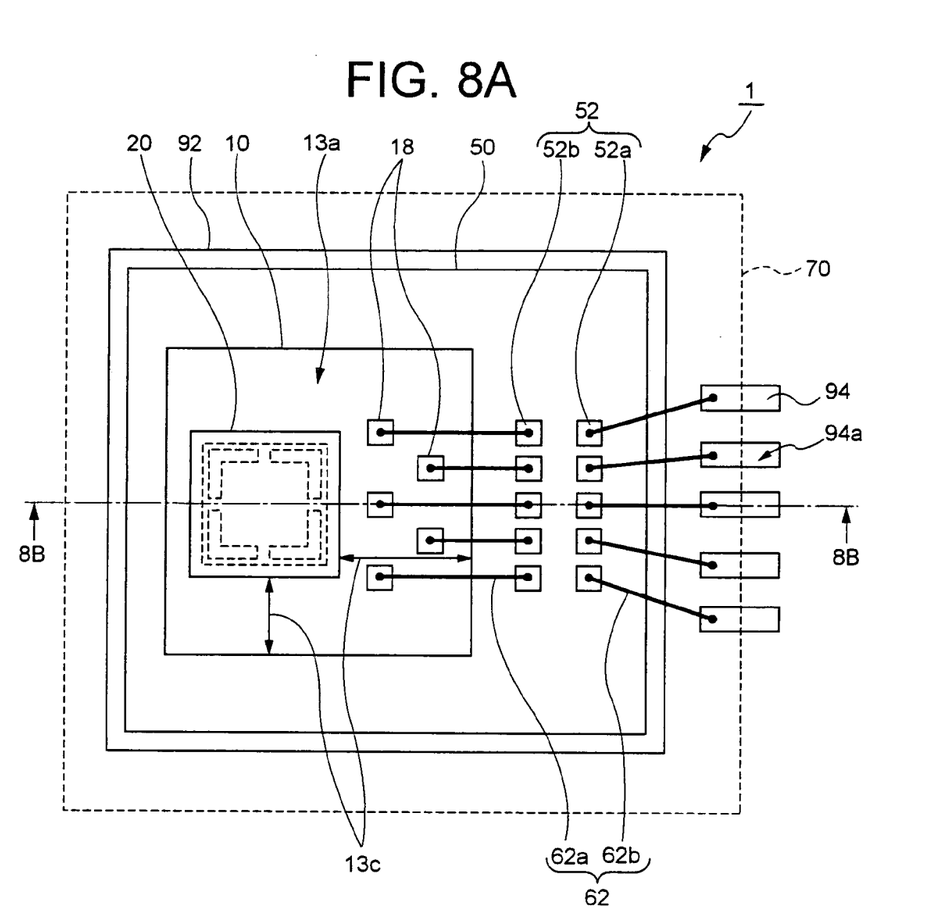
FIG. 8A is a plan view depicting the composing elements of the semiconductor device according to the fourth embodiment of the present invention.
Figure 8B:
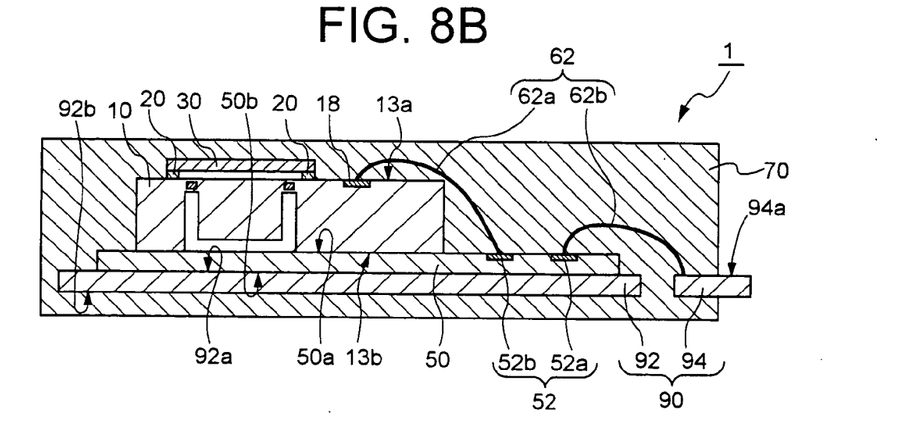
FIG. 8B is a cross-sectional view taken along the dashed line 8B-8B in FIG. 8A.

FIG. 8A depicts the composing elements of the semiconductor chip package of the fourth embodiment viewed from the top. FIG. BB depicts a cross-section sectioned at the dashed line 8B-8B in FIG. 8A. In FIG. 8A, the second sealing section 70 shown in FIG. 8B is omitted to clarify the internal configuration, and only the contour thereof is shown by the dotted line.

The semiconductor device 1 of the present embodiment is the same as the semiconductor devices of the second and third embodiments, except that the lead frame is used instead of the ceramic header or the substrate in the packaging. Therefore, the same composing elements are denoted with the same reference numbers in FIG. 6A to FIG. 8B, and a detailed description thereof Is omitted.

The semiconductor chip package 1 includes the lead frame 90. The lead frame 90 may be a common lead frame made of such material as copper (Cu). The lead frame 90 has a chip mounting section 92 on which the first and second semiconductor chips are mounted and a plurality of leads 94 which are away from the chip mounting section 92.

The chip mounting section 92 is a square in this embodiment, which has a first face 92a and a second face 92b. The first face 92a is in parallel to the second face 92b. The chip mounting section 92 has a size which allows mounting the second semiconductor chip 50 on the first face 92a.

Each of the leads 94 has a thin and elongated plate shape. Five leads 94, which are the same number as the substrate connection pads 52a of the second semiconductor chip 50, are formed with equal spacing with each other. The five leads 94 are away from the one side of the square chip mounting section 92.

The second bonding wires 62b connect the leads 94 and the substrate connection pads 52a one-to-one.

The semiconductor device 1 has a second sealing section 70 for sealing a chip mounting section 92 of the lead frame 90, a part of the leads 94, the first semiconductor chip 10, the second semiconductor chip 50 and the bonding wires 62.

The second sealing section 70 can be formed by an ordinary method with a known semiconductor sealing device having a die, using such sealing resin as epoxy mold resin or liquid sealing material. Some parts of the leads 94 are exposed out of the second sealing section 70 as the exposed sections 94a. These exposed sections 94a function as external terminals.

The lead frame is normally a thin metal plate. Therefore, the semiconductor device can be slimmer.

The semiconductor device 1 of the present embodiment can be fabricated according to an ordinary method. Specifically, the first and second semiconductor chips 10 and 50 are mounted on the chip mounting section 92 of the lead frame 90. The first electrode pads 18 of the first semiconductor chip 10 and the second electrode pads 52 of the second semiconductor chip 50 are bonded by the first bonding wires 62a. The second electrode pads 52 of the second semiconductor chip 50 and the leads 94 of the lead frame 90 are connected by the second bonding wires 62b. By the sealing step using die, the second sealing section 70 Is formed such that the section 94a is exposed. The leads 94 positioned outside the chip mounting area 92 and the exposed section 94a are cut from the lead frame main unit to separate the dies. By the above steps, the semiconductor device 1 having the above mentioned structure are obtained.

This application is based on Japanese Patent Application No. 2005-195833 filed on Jul. 5, 2005 and the entire disclosure thereof is incorporated herein by reference.

What is claimed is:

1. A semiconductor chip package comprising:
    a first semiconductor chip including:
        a frame section having a top face and a bottom face,
        a movable structure having a movable section formed in said frame section,
        a plurality of first electrode pads arranged on said top face of said frame section,
        a first sealing section formed on the top face of said frame section and having a closed loop shape surrounding said movable structure, and
        a thin plate member provided on said first sealing section for sealing said movable structure;
    a second semiconductor chip having a first surface, a second surface, and a plurality of second electrode pads arranged on said first surface, the first surface being in parallel to the second surface;
    a substrate including a first main surface having a semiconductor chip mounting area, a second main surface, and a plurality of third electrode pads formed along one edge of said first main surface outside said semiconductor chip mounting area, said first and second semiconductor chips being mounted on said semiconductor chip mounting area, and said first main surface being in parallel to the second main surface;
    first bonding wires for connecting said plurality of first electrode pads to said plurality of second electrode pads respectively; and
    second bonding wires for connecting said plurality of second electrode pads to said plurality of third electrode pads respectively.

2. The semiconductor chip package according to claim 1, wherein said second semiconductor chip is mounted on said chip mounting area such that the second surface of said second semiconductor chip is in contact with said chip mounting area, and said first semiconductor chip is mounted on said first surface of said second semiconductor chip such that said bottom face of said first semiconductor chip is in contact with said second semiconductor chip, with said second electrode pads of said second semiconductor chip exposed.

3. The semiconductor chip package according to claim 1, wherein said substrate is a container type ceramic header having a concave section, and said semiconductor chip mounting area is formed in said concave section.

4. The semiconductor chip package according to claim 1, wherein said substrate is a metal substrate or a resin substrate.

5. The semiconductor chip package according to claim 1 further comprising a second sealing section for covering and sealing said first semiconductor chip, said second semiconductor chip, said first sealing section, said first bonding wires and said second bonding wires.

6. The semiconductor chip package according to claim 1, wherein said first sealing section is formed of resin.

7. The semiconductor chip package according to claim 1, wherein said first sealing section is formed of a sheet member.

8. The semiconductor chip package according to claim 1, wherein said first semiconductor chip is an MEMS chip.

9. A semiconductor chip package comprising:
   a first semiconductor chip including:
      a frame section having a top face and a bottom face,
      a movable structure having a movable section formed in said frame section,
      a plurality of first electrode pads arranged on said top face side of said frame section,
      a first sealing section formed on the top face of said frame section and having a closed loop shape surrounding said movable structure, and
      a thin plate member provided on said first sealing section for sealing said movable structure;
   a second semiconductor chip having a first surface, a second surface, and a plurality of second electrode pads arranged on said first surface, the first surface being in parallel to the second surface;
   a lead frame including a chip mount section that has a front face and a back face, and a plurality of leads provided away from an edge of said chip mounting section, said first and second semiconductor chips being mounted on said front face of said chip mounting section;
   first bonding wires for connecting said plurality of first electrode pads to said plurality of second electrode pads respectively;
   second bonding wires for connecting said plurality of second electrode pads to said plurality of leads respectively; and
   a second sealing section for covering and sealing said first semiconductor chip, said second semiconductor chip, said first sealing section, said chip mounting section, said first bonding wires and said second bonding wires, with a part of said plurality of leads being exposed.

10. The semiconductor chip package according to claim 9, wherein said first sealing section is formed of resin.

11. The semiconductor chip package according to claim 9, wherein said first sealing section is formed of a sheet member.

* * * * *